United States Patent [19]

Basavanhally et al.

[11] Patent Number: 4,763,412
[45] Date of Patent: Aug. 16, 1988

[54] METHOD AND APPARATUS FOR INSERTING PINS IN A SUBSTRATE

[75] Inventors: Nagesh R. Basavanhally, Hamilton Township, Mercer County; Herbert A. Pohl, Raritan Township, Hunterdon County; Willard E. Rapp, Franklin Township, Somerset County, all of N.J.

[73] Assignee: American Telephone and Telegraph Company, New York, N.Y.

[21] Appl. No.: 878,903

[22] Filed: Jun. 26, 1986

[51] Int. Cl.⁴ .............................................. H01R 9/09
[52] U.S. Cl. ........................................ 29/845; 29/844; 29/564.6
[58] Field of Search ...................... 29/844, 845, 564.6

[56] References Cited

U.S. PATENT DOCUMENTS

| | | | |
|---|---|---|---|
| 3,136,040 | 6/1964 | Bauer et al. | 29/203 |
| 3,216,096 | 11/1965 | Rayburn | 29/203 |
| 3,611,561 | 10/1971 | Dosier | 29/626 |
| 3,624,676 | 11/1971 | Whitney et al. | 29/203 |
| 4,099,324 | 7/1978 | Johnson et al. | 29/739 |
| 4,202,092 | 5/1980 | Shibasaki et al. | 29/741 |
| 4,270,267 | 6/1981 | Bakermans | 29/881 |
| 4,403,726 | 9/1983 | Snyder et al. | 227/149 |
| 4,519,132 | 5/1985 | Kleinedler et al. | 29/845 |
| 4,543,714 | 10/1985 | Seffernick et al. | 29/845 |
| 4,598,471 | 6/1986 | Elsbree et al. | 29/845 |

Primary Examiner—P. W. Echols
Assistant Examiner—Taylor J. Ross
Attorney, Agent, or Firm—R. B. Levy

[57] ABSTRACT

Automated insertion of pins (14) into apertures (12) in a backplane (10) is achieved by first shearing a predetermined number of pins from a continuous strip of pins (26). The sheared pins (12) are then engaged in a pin holder (134) which is indexed to locate the pins in registration with the apertures (12) in the backplane (10). The pin holder (134) is displaced towards the backplane (10) to insert the pins (14) into the apertures (12). As the pins are inserted, they are simultaneously engaged by a pair of guide fingers (244) which travel therewith to guide the engaged pins into the apertures without interfering with any previously inserted pins. The guide fingers disengage themselves from the pins once insertion thereof is substantially completed. An apparatus (10) is also described for carrying the above-described steps in sequence.

18 Claims, 12 Drawing Sheets

1

METHOD AND APPARATUS FOR INSERTING PINS IN A SUBSTRATE

TECHNICAL FIELD

This invention relates to a method and apparatus for automated insertion of pins into a substrate, such as a backplane employed for interconnecting circuit boards.

BACKGROUND OF THE INVENTION

Many kinds of electronic equipment are comprised of two or more circuit boards which are interconnected to each other by way of a backplane. A typical backplane takes the form of a substrate (e.g., glass epoxy) having a plurality of spaced apertures therein, each sized to receive one end of a conductive pin which typically extends therethrough. Each pin extends from the backplane into a passage in an edge connector carried by a separate one of the circuit boards. An electrical contact finger extends into the passage in the edge connector and connects the pin to a metallized pattern on the circuit board. The ends of the pins received in the backplane apertures are selectively interconnected, either by metallized patterns on the backplane, or by separate wire conductors, to interconnect two or more circuit boards.

The length of the pins inserted into the backplane apertures and the spacing therebetween is determined by the size and number of circuit boards to be interconnected thereby, as well as the component density on each board. In certain types of electronic equipment, such as large digital computers, it is not unusual for the backplane to have as many as two thousand pins, arranged in one or more matrix arrays. The spacing between adjacent pins in each array is often no larger than 3-4 mm. Further, the length of the pins often varies from array to array on a single backplane. The close spacing between the pins and the variation in the size thereof have made automation of the pin insertion process very difficult. As a result, insertion of pins into the backplane has required a large amount of manual labor, making the process expensive and time consuming.

Accordingly, there is a problem in achieving high-speed, automated insertion of pins into a substrate, such as a backplane.

BRIEF SUMMARY OF THE INVENTION

The instant invention substantially overcomes the foregoing problems by providing for a technique for automated insertion of a pin into apertures in a substrate. Initially a pin is separated from a continuous strip of pins. Thereafter the pin is aligned with an aperture in the substrate. The pin is then displaced towards the substrate for insertion therein. At the same time, the pin is engaged with guide means which travel therewith during the displacement thereof to guide the engaged pin to the aperture. Once the pin has been partially inserted into the aperture, the guide means are disengaged from the pin.

DETAILED DESCRIPTION

Figure 1:
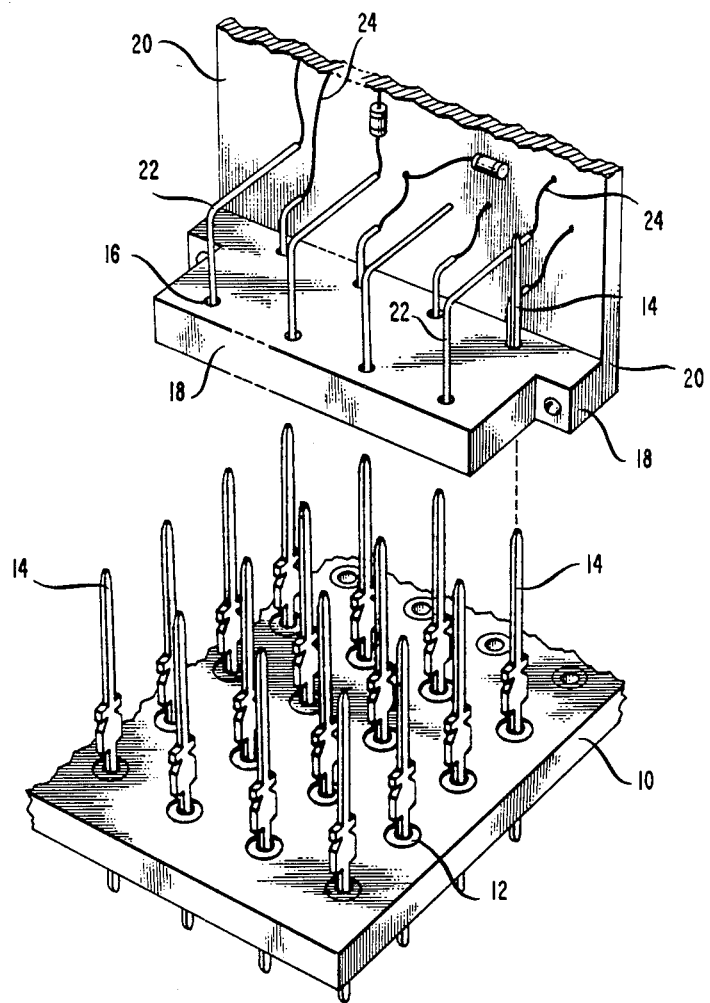
FIG. 1 is a partial perspective view of a circuit board shown in spaced relation with a backplane according to the prior art.

FIG. 1 is a partial perspective view of a prior art backplane 10 of the type found in electronic equipment. The backplane 10 is typically made of glass epoxy or the like, and has a plurality of apertures 12 therethrough. Each aperture 12 is sized to receive an end of one of a plurality of electrically conductive pins 14, which typically extend through the backplane. The pins 14 each extend normally from the backplane 10 for insertion into a separate one of a plurality of passages 16 in an edge connector 18 secured to one end of a printed circuit board 20. Each of a plurality of metal contact fingers 22 extends into each passage 16 to electrically connect the pin 14 therein to a metallized pattern 24 on the circuit board 20. To connect the pins 14 together, each of the apertures 12 in the backplane 10 is plated and metallized strips (not shown) are provided on the backplane so as to run between selected pairs of apertures. Alternatively, the pins 14 can be selectively interconnected by separate lengths of wire (not shown) running therebetween along the back side of the backplane 10.

Figure 2:
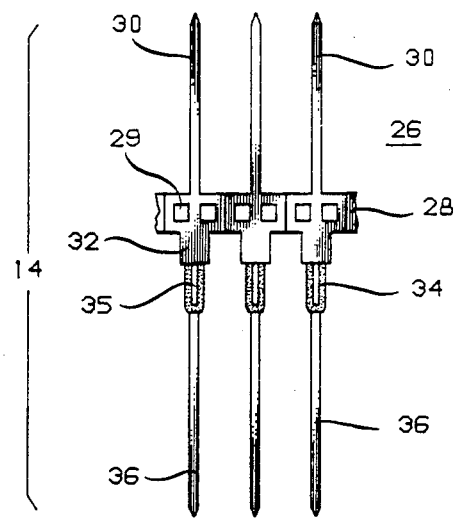
FIG. 2 is a front view of a portion of a continuous pin strip according to the prior art.

Typically, the pins 14 are not fabricated as individual elements. Rather, a single continuous pin strip 26, illustrated in FIG. 2, is first formed, typically from a nickel, copper and tin alloy, and individual pins 14 are later sheared therefrom. The pin strip 26 comprises a spine 28 having spaced perforations 29 therein. A plurality of wire-like, first members 30, each typically plated with gold or the like, extend from one edge of the spine 28 in parallel, spaced relationship. Each first member 30 is spaced equally distant between a pair of perforations 29 in the spine 28. A plurality of shoulders 32 extend from an opposite edge of the spine 28, each in alignment with a separate one of the wire-like members 30. Depending from each shoulder 32 is a solder-coated, hollowed-out, cylindrical portion 34 having a slit 35 therein to allow radial deformation thereof. Extending from each cylindrical portion 34 is a second wire-like member 36 which is also plated with gold or the like. Each second member 36 is axially aligned with each first member 30. When the spine 28 is severed at the point where each of the perforations 29 extends therethrough, separate individual pins 14 are obtained therefrom.

Figure 3:
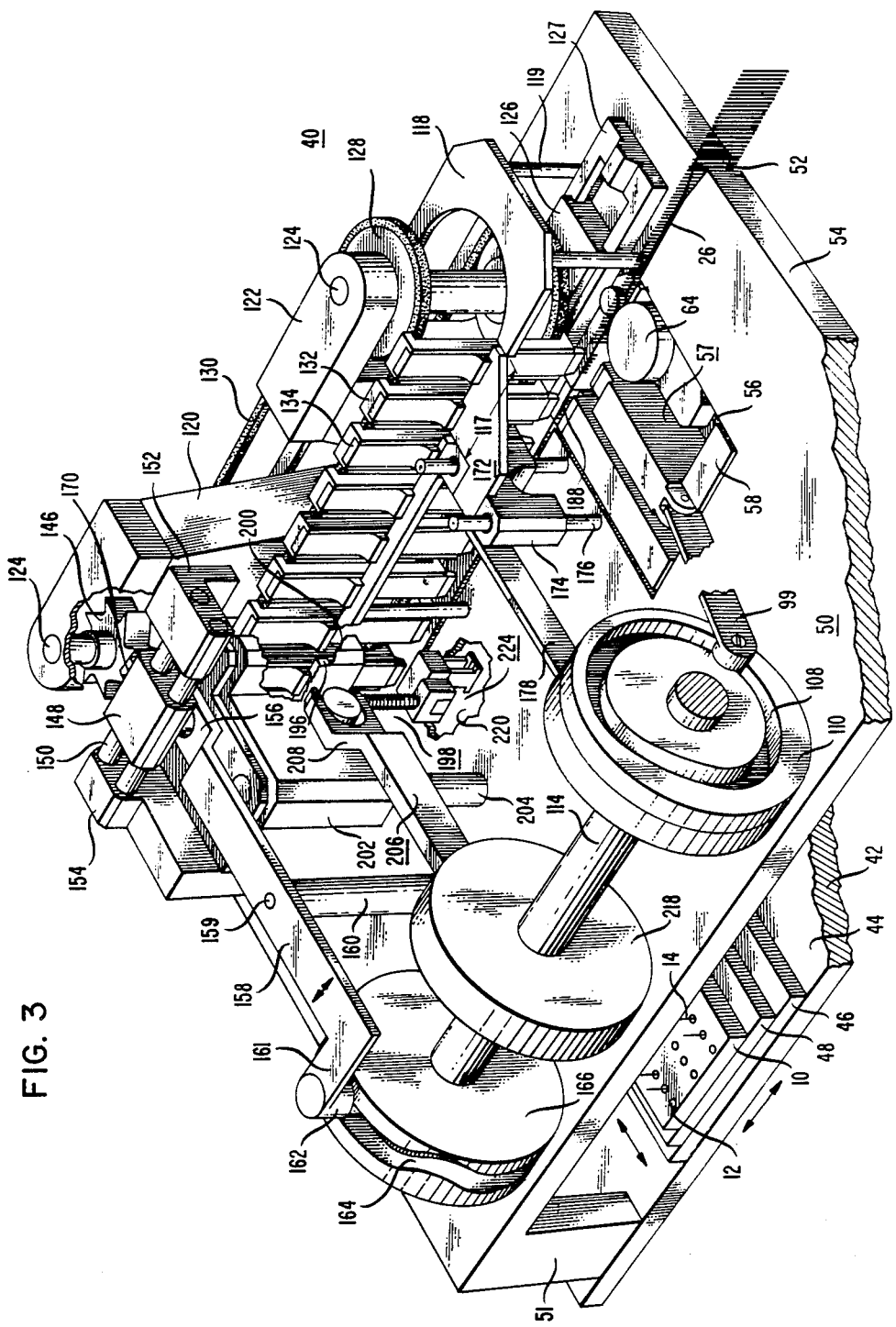
FIG. 3 is a perspective view of an apparatus according to the present invention for automatically inserting pins into the backplane of FIG. 1.

FIG. 3 is a perspective view of a machine 40 for achieving automated insertion of the pins 14 into corresponding apertures 12 in the backplane 10. The pin insertion machine 40 comprises a base plate 42 whose upper surface 44 has a servo-driven x-y table 46 mounted thereon. Fastened to the x-y table 46 is a fixture 48 for securing the backplane 10 thereto. Overlying the base plate 42 is a framework 50 which is supported therefrom by a plurality of legs 51. The spacing between the base plate 42 and the framework 50 is sufficient to enable the backplane 10, when populated with the pins 14, to clear the framework.

The framework 50 has a slot 52 extending inwardly from an edge 54 thereof. The slot 52 is sized wide enough to accommodate the pin strip 26 which is advanced therein by a servo-controlled feed mechanism (not shown). It should be understood that pin strips 26 of different heights can be fed, in sequence, into the slot 52.

The slot 52 leads into a recess 56 containing a pin separation station 57 at which the individual pins 14 are separated from the strip 26. The pin separation station 57 comprises a frame 58 secured to the framework 50. As best seen in FIG. 5, a punch 60 and a die 62 are each carried by the frame 58. In addition, the frame 58 carries a pair of spaced, rotatable guide wheels 64 and 66 (see FIG. 4) located at the mouth of the recess 56 so as to be on opposite sides of the strip 26 fed therein. The wheels 64 and 66 (see FIG. 4) guide the pin strip 26 entering the recess 56 between the punch 60 and the die 62 (both shown in FIG. 5). Typically, one of the wheels 64 and 66 (see FIG. 4) is provided with radially spaced bosses (not shown) on the periphery thereof to engage the perforations 29 (FIG. 2) in the spine 28 (FIG. 2) of the pin strip 26. The guide wheel 64 is typically adjustably mounted to the frame 58 to allow the spacing between the two guide wheels to be varied.

Figure 4:
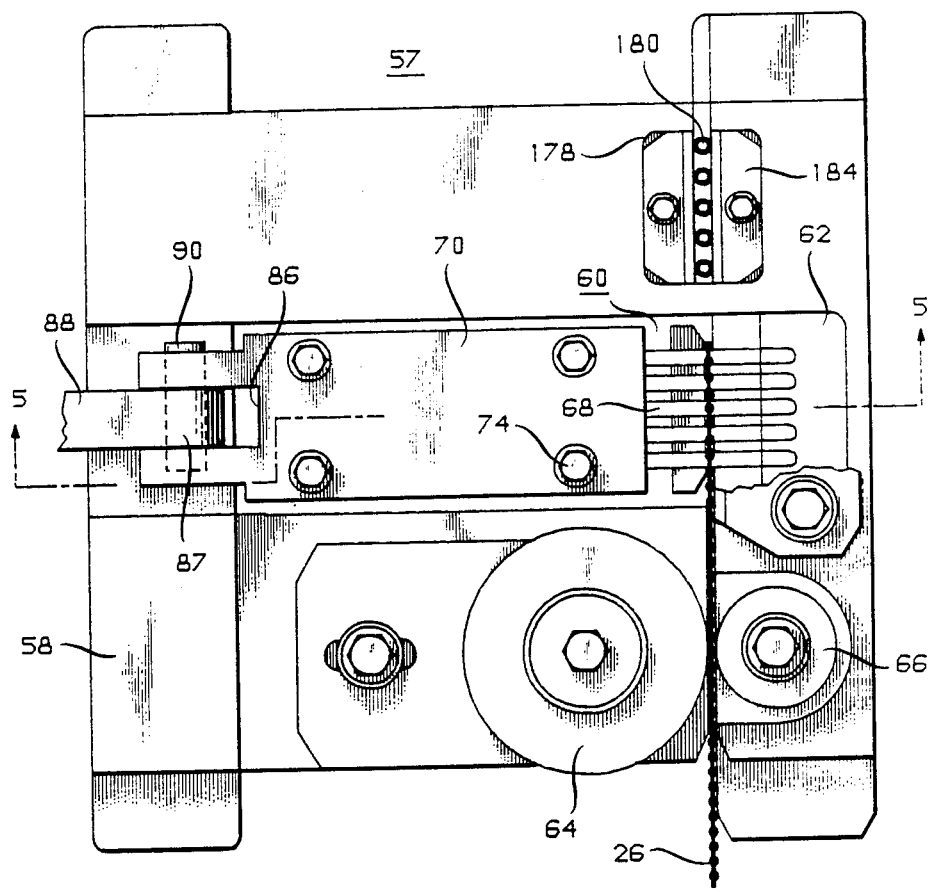
FIG. 4 is a plan view of a portion of the apparatus of FIG. 3 showing details of a pin separation station thereon.
Figure 5:
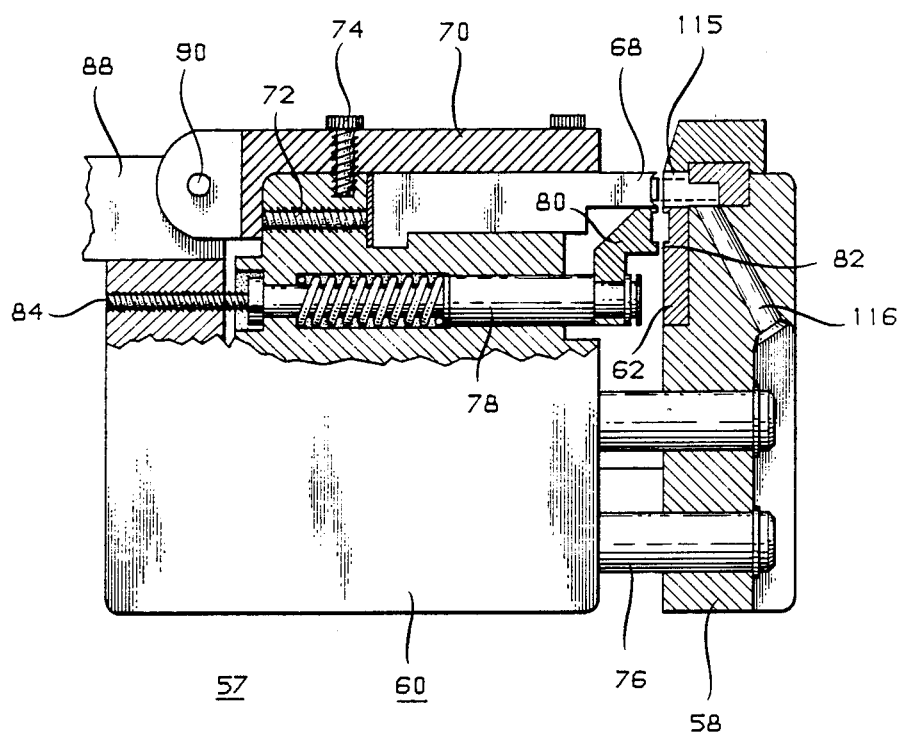
FIG. 5 is a cross-sectional view taken along the plane 5—5 of FIG. 4.

Referring to FIG. 4, the punch 60 (see FIG. 5) carries five parallel, horizontally spaced, cutting tools 68 which extend therefrom towards the die 62. The lateral spacing between the cutting tools 68 corresponds to the spacing between the perforations 29 (see FIG. 2) in the spine 28 (FIG. 2) of the pin strip 26. As best seen in FIG. 5, each cutting tool 68 is secured within the punch 60, below a coverplate 70, by a set screw 72. The plate 70 is removably attached to the punch 60 by screws 74 to permit access to the cutting tools 68, allowing them to be removed for sharpening or replacement as necessary.

Referring to FIG. 5, the punch 60 is slidably mounted along a pair of shafts 76, attached to the frame 58, to enable reciprocal movement of the punch to and from the die 62. A plunger 78 is horizontally spring biased in the punch 60 below the cutting tools 68. The plunger 78 extends outwardly from the punch 60 so as to be spaced a short distance from the die 62. A stripper plate 80, having a set of teeth 82 extending therefrom towards the die 62, is attached to the end of the plunger 78 extending from the punch 60. A set screw 84 is threaded into the frame 58 to abut the plunger 78 for adjusting the outward extension thereof to control the distance between the teeth 82 on the stripper plate 80 and the die 62.

Figure 6:
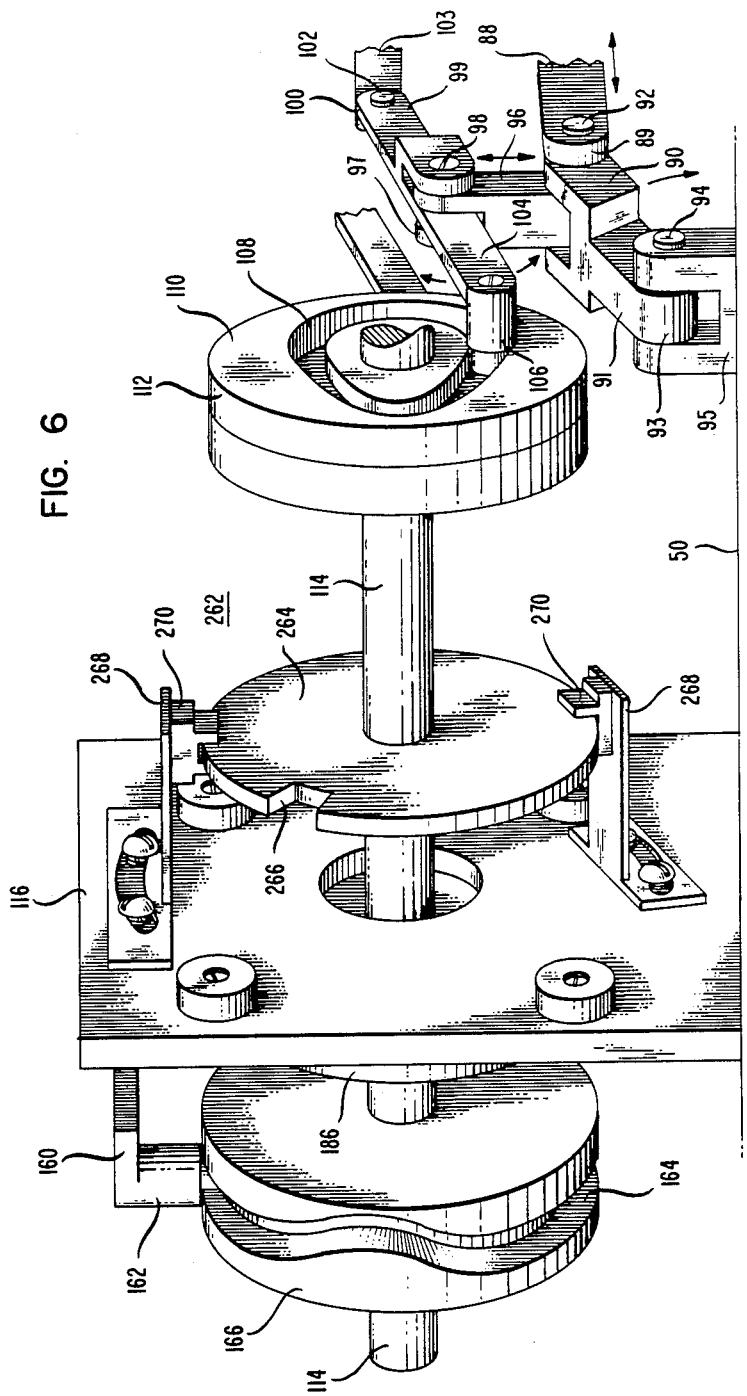
FIG. 6 is an enlarged perspective view of a portion of the apparatus of FIG. 3 showing the details of a mechanism for driving the pin separation station of FIG. 4.

As seen in FIG. 4, a slot 86 is provided in the top of the punch 60 to receive one end 87 of a bar 88 which is pivotally connected to the punch by a pin 90. Referring to FIG. 6, the bar 88 has its opposite end 89 rotatably connected to one end 90 of a link 91 by a pivot pin 92. The link 91 has its opposite end 93 rotatably connected by a pivot pin 94 to a yoke 95 attached to the framework 50.

A link 96 has one end thereof (not shown) pivotally connected to the end 90 of the link 91 by the pin 92. The link 96 has its other end 97 rotatably connected by a pin 98 to the midpoint of a bar 99. The bar 99 has one end 100 thereof rotatably coupled by a pivot pin 102 to a fixed support 103 extending normally from the framework 50. The bar 99 is provided at its end 104 opposite the end 100 with a cam follower 106 which rides in a groove 108 in one face 110 of a cam 112. The cam 112 is carried by a shaft 114 which is rotatably journaled through a set of spaced, parallel walls 116 (only one shown), each affixed at their base to the framework 50. A d.c. motor (not shown) is coupled to the shaft 114 for imparting a torque thereto.

When the shaft 114 is rotatably driven, the cam follower 106 rides in the groove 108. The shape of the groove 108 is such that as the cam follower 106 rides along a predetermined portion thereof during part of the arc of rotation of the cam 112, the bar 99 pivots in opposite directions through a short arc about the pin 102. As a result, the bar 96 is reciprocated up and down, as seen in FIG. 6, causing the link 91 to pivot in a short arc about the pin 94. The pivotal movement of the link 91 about the pin 94 causes the end 89 of the bar 88 to pivot in a short arc about the pin 92. The pivotal movement of the end 89 of the bar 88 causes the punch 60 (see FIG. 5) at the opposite end 87 of the bar to move to and from the die 62 (see FIGS. 4 and 5) and shear one or more pins 14 (see FIGS. 1 and 2) from the strip 26 (see FIG. 2). During the rotation of the cam 112 through the remainder of its arc, the bar 88 remains stationary.

Referring to FIG. 4, depending on the length of the pin strip 26 advanced in between the punch 60 and die 62 (as measured by either the number of the wire members 30 or 36 (see FIG. 2) that have passed by the wheels 64 and 66), up to five pins 14 will be sheared from the strip by the cutting tools 68. As the pins 14 are sheared from the strip 26 by the punch 60, small bits of metal debris (slugs) are pressed into the face of the die 62. Referring to FIG. 5, these slugs pass through openings 115 in the die 62 and into a scrap chute 116 in communication therewith. The scrap chute 116 carries the slugs into a receptacle (not shown).

In practice, the set screw 84 of FIG. 5 is adjusted so that the teeth 82 on the stripper plate 80 contact the strip 26 (see FIG. 4) before the cutting tools 68 do. Thus, during the forward stroke of the punch 60 toward the die 62, the spring biased plunger 78 is yieldably urged into the punch 60, thereby maintaining the teeth 82 on the stripper plate 80 in contact with the strip 26. In this way, the plunger 78 and the stripper plate 80 keep the strip 26 against the die 62 while the cutting tools 68 are withdrawn during the back stroke of the punch 60.

Referring to FIG. 3, the die 62 lies below an opening 117 in a horizontal, race-track-shaped guide rail 118 which is supported a short distance from the framework 50 by a set of parallel, spaced poles 119. The guide rail 118 circumscribes a pair of spaced columns 120 and 122 which each have one of a pair of shafts 124 vertically journaled therein so that all but the ends of each shaft are exposed through each column. The column 120 is fixedly attached to the framework 50. The column 122 is mounted on a carriage 126 which slides along a track 127 attached to the framework 50 so the spacing between the columns 120 and 122 can be adjusted. Once the spacing between the columns 120 and 122 has been adjusted, the carriage 126 is made fast to the track 127.

Each of the shafts 124 carries upper and lower spaced sprockets 128 thereon. The upper and lower sprockets 128 on each shaft 124 each have one of a pair of chains 130 looped thereabout. Each of the sprockets 128 on each of the shafts 124 is of a diameter such that each of the chains 130 lies within the inside periphery of the rail 118. The chains 130 are each attached to one of the two ends, respectively, of each of a plurality of equally spaced, elongated channel members 132. Typically, the combined width of an adjacent pair of channel members 132 (including the spacing therebetween) is slightly less than the width of the opening 117 in the rail 118. Although not shown in FIG. 3, the channel members 132 are spaced about the entire circumference of the chains 130.

Figure 7:
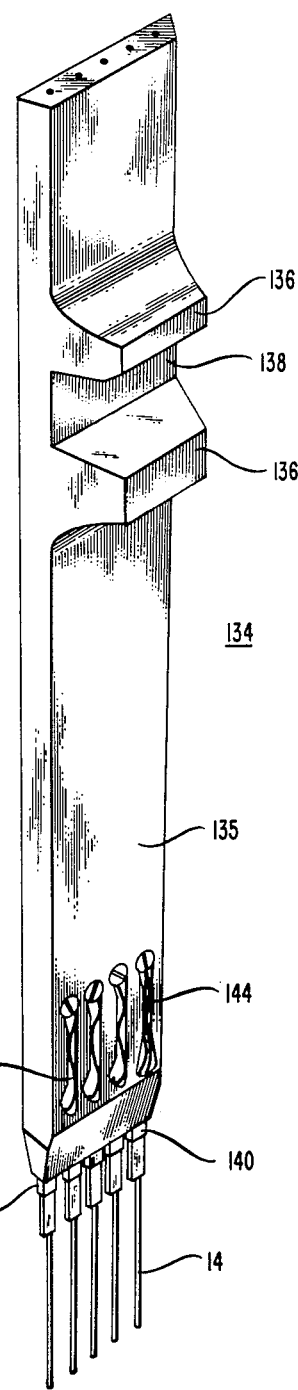
FIG. 7 is a perspective view of a pin holder on the apparatus of FIG 3.

Within each channel member 132 is a pin holder 134 slidably mounted for reciprocal movement therein. As seen in FIG. 7, each pin carrier 134 is generally planar in shape and has a front face 135 from which a pair of lips 136 extend normally therefrom. Between the lips 136 is a notch 138 which accommodates the guide rail 118 of FIG. 3 so that the pin holder 134 is thus prevented from falling through the channel 132 of FIG. 3.

Figure 14:
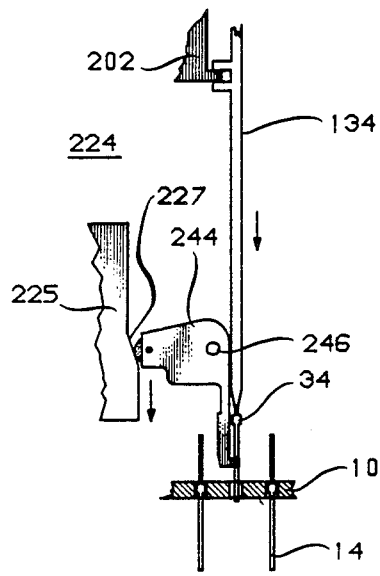
Figure 15:
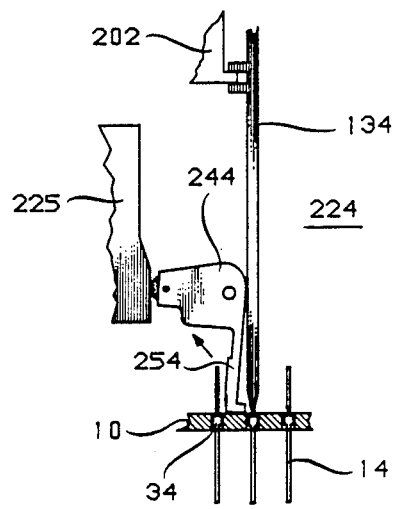

As seen in FIG. 7, five spaced sockets 140 depend from the bottom of the pin holder 134. The sockets 140 are spaced apart the same distance as the wire-like members 30 of FIG. 2, which each form the upper end of each individual pin 14 severed from the strip 26 of FIG. 2. The outer diameter of each socket 140 and the thickness of the pin holder 134 itself are typically smaller than the spacing between apertures 12 in the backplane 10 (see FIG. 1). This allows the sockets 140 and the pin holder 134 to fit between two rows of apertures in the backplane previously populated with pins 14, as seen in FIGS. 14–15.

Each socket 140 of FIG. 7 has a vertical bore (not shown) therein sized to receive the upper end of each severed pin 14. The vertical bore in each of the sockets 140 communicates with a separate one of five "kidney"-shaped openings 142 in the face 135 of the pin holder 134. Each opening 142 is sized to receive one of five arcuate leaf springs 144. Each spring 144 biases the upper end of the pin 14 received through the socket 140 against a wall of the opening 142 to releasably retain the pin within the pin holder 134.

Referring to FIG. 3, the channel members 132 are indexed along the guide rail 118 upon movement of the chains 130. To facilitate movement of the chains 130, the shaft 124 vertically journaled in the column 120 is provided with a ratchet gear 146 at one end thereof. Located almost tangent to the rachet gear 146 is a block 148 which is slidably mounted for movement along a pair of spaced, parallel shafts 150. The shafts 150 extend between a bracket 152, extending horizontally out from column 120, and the top of a support 154 rising normally from the framework 50, respectively.

The block 148 is pivotally attached to one end 156 of an "L"-shaped arm 158 which is rotatably connected at its midpoint by a pin 159 to the top of a column 160 extending normally from the framework 50. The arm 158 is provided at its other end 161 with a depending cam follower 162 which rides in a cammed groove 164 in the periphery of a cam 166 carried by the shaft 114. The shape of the cammed groove 164 is such that as the cam follower 162 rides along a predetermined portion of the groove during part of the arc of rotation of the cam 166, the arm 158 pivots about the pin 159 so that the end 156 of the arm moves in a short horizontal arc. The arc-like motion of the end 156 of the arm 158 causes the block 148 to move back and forth along the shafts 150. As the cam follower 162 rides along the remaining portion of cammed groove 164 during the remainder of the rotation of the cam 166, the arm 158 remains generally stationary.

When the block 148 is displaced along the shafts 150 in a first direction, a pawl 170, extending from the block, catches a tooth on the rachet gear 146, causing the gear to rotate in a clockwise direction through a short arc, hereinafter referred to as an "indexing stroke." As the gear rotates through the indexing stroke, the chains 130 move simultaneously therewith. In this way, the channel members 132, and the pin holders 134 slidably mounted therein, are indexed along the guide rail 118 during each indexing stroke of the ratchet gear 146. When the block 148 is displaced along the shafts 150 in the opposite direction, the pawl 170 moves past the ratchet 146 without catching any of the teeth thereof. Thus, the channel members 132 and the pin holders 134 move only in a clockwise direction along the guide rail 118.

During each indexing stroke of the ratchet gear 146, a pair of pin holders 134 is indexed into the opening 117 in the rail 118 so one of the pair overlies the void between the punch 60 and the die 62. As each of the pair of pin holders 134 enters the opening 117, the lips 136 (see FIG. 7) on each pin holder straddle an edge of a plate 172 attached to, and extending horizontally from, the top of a block 174. The block 174 is slidably mounted on, for movement along, a pair of parallel, spaced poles 176 normal to the framework 50.

Figure 8:
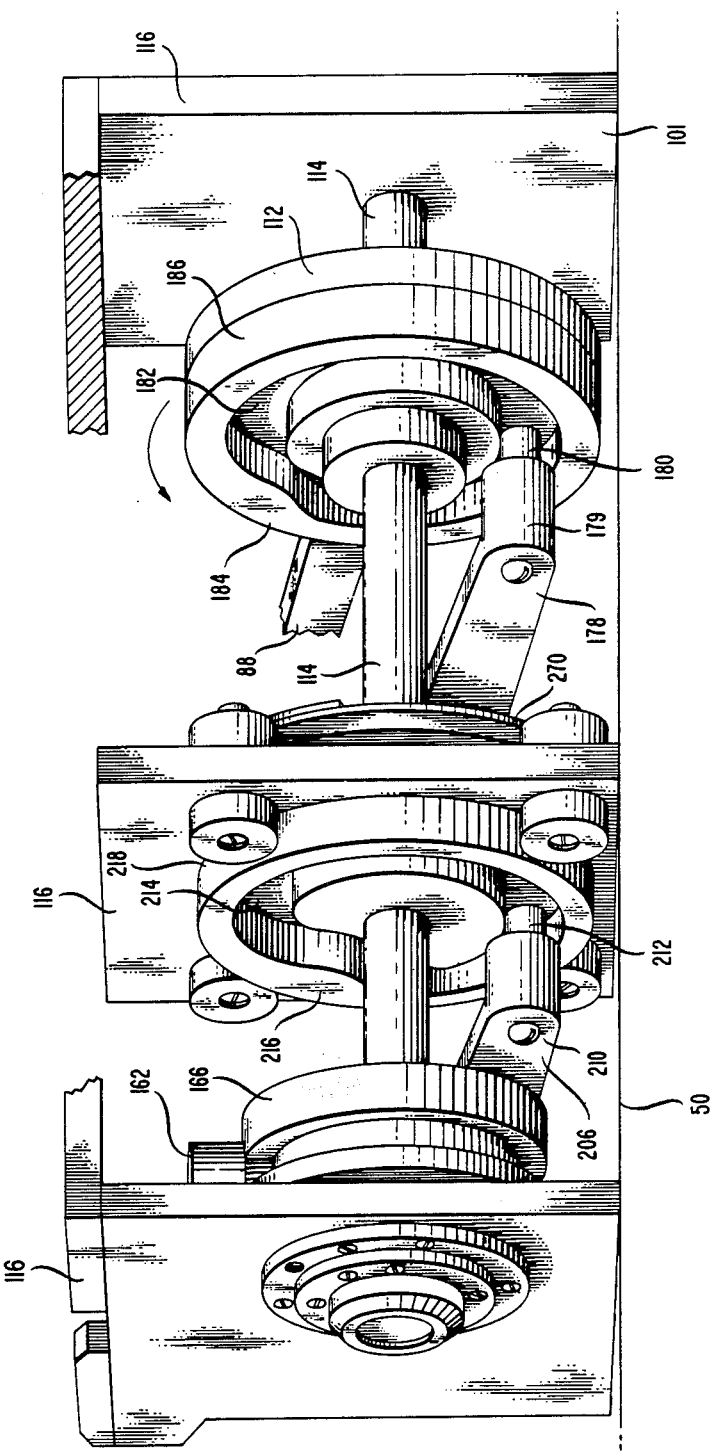
FIG. 8 is a perspective view of another portion of the drive mechanism of FIG. 6.

The block 174 is pivotally attached to one end (not shown) of an arm 178. Referring to FIG. 8, which illustrates another portion of the shaft 114, the arm 178 is provided at its opposite end 179 with a cam follower 180. The cam follower 180 rides in a cammed groove 182 in one face 184 of a cam 186 carried on the shaft 114 in abutment with the cam 112. The shape of the cammed groove 182 is such that, as the cam follower 180 rides along a predetermined portion thereof during part of the arc of rotation of the cam 186, the arm 178 displaces the block 174 of FIG. 3 once to and from the framework 50 (see FIG. 3) along the poles 176. While the cam follower 180 rides along the remaining portion of the cammed groove 182 as the cam 166 continues to rotate through its arc, the arm 178 and block 172 remain substantially stationary.

Referring to FIG. 8, even though the cams 112 and 186 rotate simultaneously on the shaft 114, the reciprocation of punch 60 (see FIG. 5) and the reciprocation of the block 174 do not occur at the same time. The downstroke of the block 174 towards the framework 50 precedes the forward stroke of the punch 60 (see FIG. 5) towards the die 62. As the block 174 moves downwardly towards the framework 50, so do the pair of pin holders 134 indexed into engagement with the plate 172. The pin holder 134 of the pair which overlies the void between the punch 60 (see FIG. 5) and the die 62 (see FIG. 4) will, upon the downstroke of the block 174, engage the upper end of the pins 14, just before they are severed from the strip 26. The severed pins 14 extend through the sockets 140 (see FIG. 7) in the pinholder 134 so as to be engaged by the springs 144 (see FIG. 7) in the openings 142 (see FIG. 7) to enable the pins to be lifted from the recess 56 upon the upstroke of the pin holder.

In practice, the pins 14 severed from the strip 26 do not fully seat themselves in the pin holder 134 during the downstroke thereof. For this reason, a pin push-up station 188, as seen in FIG. 3, is located within the recess 56 downstream from the die 62 (see FIG. 4) for pushing the pins 14 further into the pin holder 134. The pin push-up station 188 is separated from the die 62 (see FIG. 4) by the same distance as the spacing between an adjacent pair of pin holders 134. Thus, when a pair of the pin holders 134 is indexed into the opening 117 in the rail 118, one pin holder overlies the void between the punch 60 (see FIG. 5) and die 62 (see FIG. 4) while the other one upstream therefrom overlies the pin push-up station 188.

Figure 9:
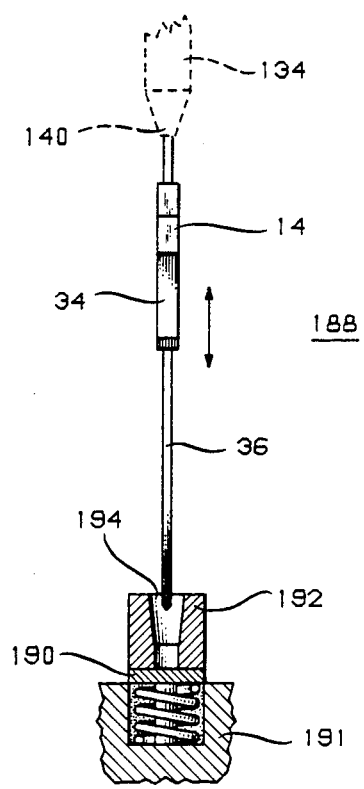
FIG. 9 is a cross-sectional side view showing the details of a pin push-up station on the apparatus of FIG. 3.

FIG. 9 is a cross-sectional side view of the pin push-up station 188 showing the details thereof. The pin push-up station 188 comprises five fillister-headed cylindrical members 190 (only one shown) slidably mounted to, and spring-biased upwardly from, a support 191 attached to the frame 58 (see FIG. 3). The members 190 are arranged so that each underlies a corresponding one of the sockets 140 depending from the pin holder 134 indexed above the pin push-up station 188. A guide plate 192 is supported by the members 190 a short distance from the support member 191. Within the guide plate 192 are five tapered through-apertures 194, each in registration with a separate one of the members 190. Each aperture 194 is sized to receive one of the pins 14 engaged by the pin holder 134 indexed into registration therewith.

When the pin holder 134 overlying the pin push-up station 188 is displaced towards the station, the pins 14 engaged by the pin holder enter the apertures 194 and contact the members 190. Typically, the force required to urge the member 190 towards the support member 191 is slightly greater than the force required to urge the pin 14 further into the pin holder 134. Thus, upon contact with the members 190, the pins 14 are urged thereby further through the sockets 140 and into the pin holder 134 during the downstroke thereof. The height of the members 190, as well as the spring force required to urge them towards the support member 191, is established such that the pins 14 engaged by the pin holder 134 do not bend during the downstroke thereof.

Referring to FIG. 3, downstream of the opening 117 in the rail 118, there is a second opening 196 which is sized slightly wider than the width of one of the channel members 132. The opening 196 is separated from the opening 117 by a distance such that, upon each indexing stroke of the ratchet gear 146, one of the channel members 132 is indexed into the opening 196. Located opposite the opening 196 is a pin insertion station 198. At the pin insertion station 198, the lips 138 (see FIG. 7) on the pin holder 134 indexed into the opening 196 straddle a horizontally extending flange 200, best seen in FIG. 10, on a block 202. The block 202 is slidably mounted to, for reciprocal movement along, a pair of parallel, spaced vertical shafts 204 (only one is shown in FIG. 3) extending normally from the framework 50.

An arm 206 has one end 208 (see FIG. 3) thereof pivotally connected to the block 202. Referring to FIG. 8, the arm 206 has its other end 210 provided with a cam follower 212 which rides in a cammed groove 214 on a face 216 of a cam 218 carried by the shaft 114. The shape of the cammed groove 214 is such that, as the cammed follower 212 rides along part of the groove during part of the rotation of the cam 218, the arm 206 displaces the block 202 of FIG. 3 in opposite directions along the shafts 204 of FIG. 3. While the cam follower 212 rides along the remaining portion of the cammed groove 214 during the continued rotation of the cam 218, the arm 206 and block 202 of FIG. 3 remain generally stationary. Even though the cam 218 rotates cojointly with the cam 166, the upstroke of the block 202 (see FIG. 3) is completed before initiation of the indexing stroke of the ratchet gear 146 of FIG. 3.

Referring to FIG. 3, as the block 202 moves in the opposite direction along the shafts 204, the pin holder 134 indexed into engagement with the flange 200 (see FIG. 10) moves up and down to and from the framework 50. During the downstroke of the pin holder 134 now engaged with the flange 200 of FIG. 10, the pins 14 engaged by this pin holder (see FIG. 10) are displaced through an opening 220 (see FIG. 3) in the framework 50 and into the apertures 12 in the backplane 10 of FIG. 3 underlying the opening. By appropriately indexing the x-y table 46 beneath the framework 50, a group of apertures 12 in the backplane 10 can be exposed through the opening 220 and aligned with the pins 14 on the pin holder 134 in registration with the opening 200.

Figure 10:
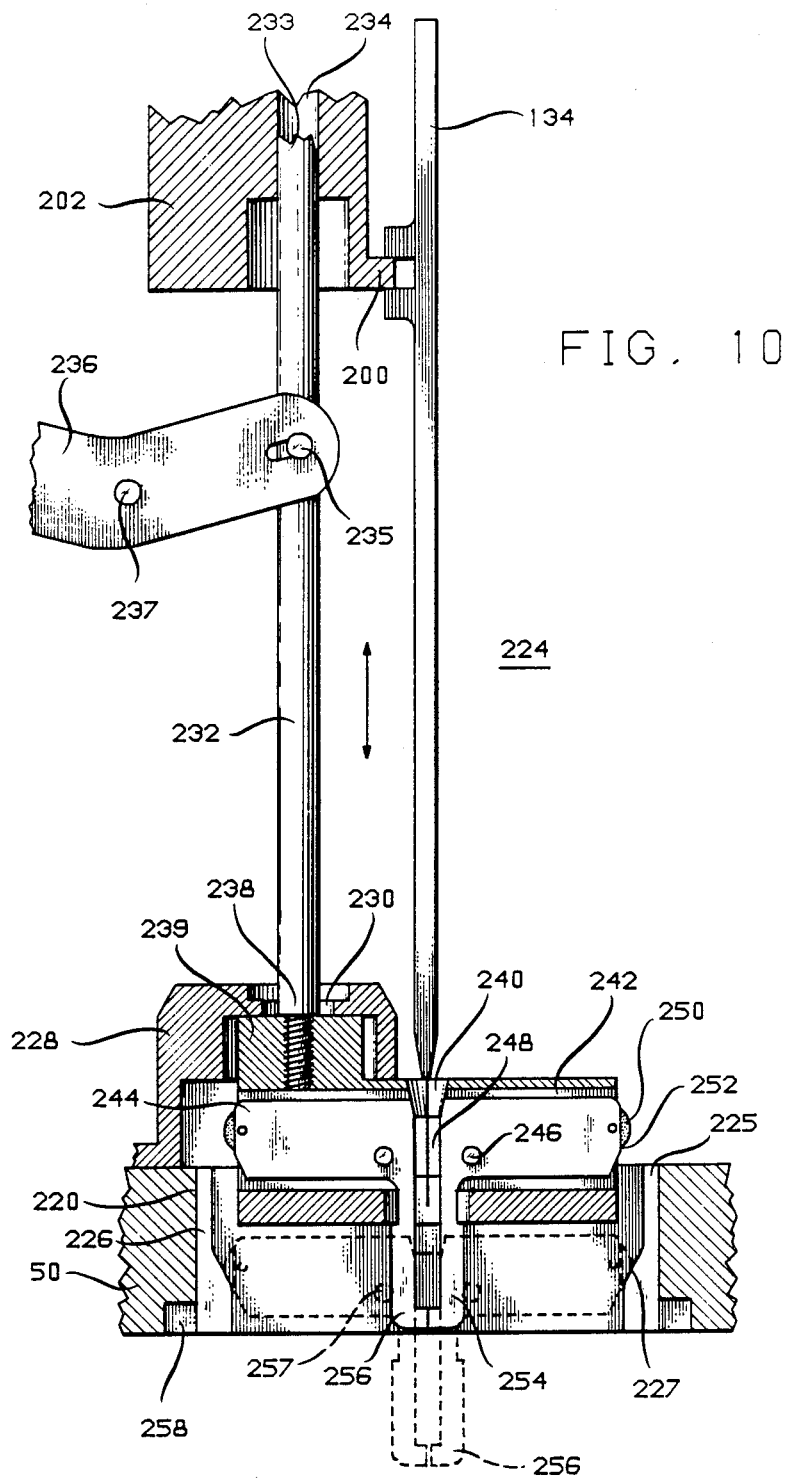
FIG. 10 is a partial cross-sectional side view showing the details of a pin guidance mechanism on the apparatus of FIG. 3.

A guiding mechanism 224, illustrated in cross section in FIG. 10, is provided to simultaneously guide the pins 14 into the apertures without interfering with any of the previously inserted pins. Referring to that figure, the guiding mechanism 224 includes a pair of opposed cammed walls 225 within the opening 220 each having an upper vertical portion 226 and a lower cammed portion 227.

Overlying a portion of the opening 220 is an overhang 228 attached to the framework 50. The overhang 228 has an opening 230 for receiving a shaft 232 therethrough. The shaft 232 has one end 233 thereof slidably mounted in a passage 234 in the block 202. A short distance down from the end 233 of the shaft is a protruding nub 235 which pivotally connects the shaft to one end of a lever 236 which pivots about a pin 237 carried by a fixed support (not shown) extending normally from the framework 50. The lever 236 is actuated by a cam (not shown) driven from the shaft 114 (see FIGS. 6 and 8) to move the shaft 232 into and out of the opening 230 during the reciprocation of the pin holder 134.

The shaft 232 has its opposite end 238 extending below the overhang 228 for threaded engagement in a block 239 which extends partially into the opening 220 so as to be spaced between the cammed walls 225. Within the block 239 is a vertical through-passage 240 in registration with the pin holder 134 indexed into engagement with the flange 200 on the block 202. A cavity 242 is provided in the block 239 in communication with the passage 240 for receiving a pair of guide fingers 244, each situated on an opposite one of the sides of the passage. A pair of pins 246 each extend into the block 239 and through each guide finger 244, proximate its end 248 closest to the passage 242, to enable the guide fingers to pivot to and from each other. A wheel 250 is journaled into an end 252 of each guide finger 244 opposite the end 248. A portion of the periphery of each wheel 250 extends beyond each end 252 of the guide finger and slightly beyond the edge of the block 239.

Each of the guide fingers 244 has a leg 254 depending from the end 248 thereof so as to be parallel with, and spaced from, the leg depending from the other guide finger. At the lower tip of each leg 254 is a horizontal comb 256 which abuts the comb on the other leg. The width of each comb 256 is less than one half the distance between a pair of apertures 12 (see FIGS. 1 and 3) in the backplane 10 of FIG. 1. When the combs 256 abut each other, they can thus fit between two rows of pins 14 (see FIG. 1) previously inserted into the backplane 10 (see FIG. 1). While the combs 256 remain in abutment with each other, each leg 254 lies inside of a separate one of a pair of sensors, 257 (e.g., photodetectors), carried by a strip 258 extending across the opening 220 between the base of the cammed portion 227 on each of the walls 225. The strip 258 is positioned so as not to interfere with the passage of the legs 254 through the opening 220.

Figure 11:
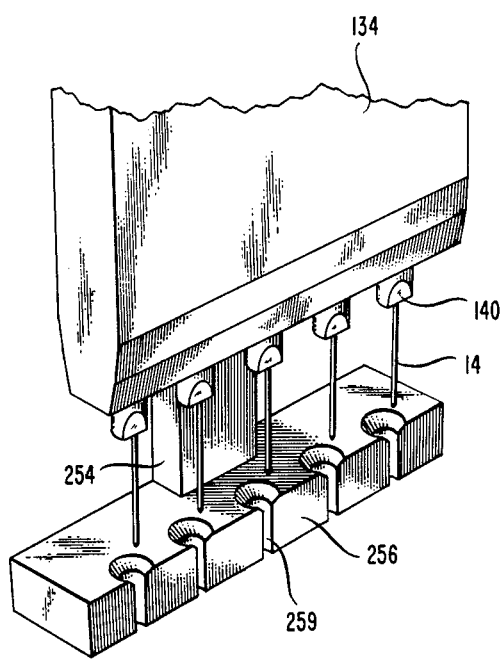
FIG. 11 is a partial perspective view of a portion of the pin guidance mechanism of FIG. 10.

The details of the comb 256 on each leg 254 are shown in FIG. 11. Referring to that figure, each comb 256 has five half-rounded slots 259 therein each in registration with a corresponding one of the sockets 140 on the pin holder 134. Each slot 259 is directly opposite to a corresponding slot in the comb 256 on the other leg 254 (not shown in FIG. 11). The slots 259 are each sized such that when the combs 256 abut each other, each pair of opposing slots creates a cylindrical passage sized to receive one of the pins 14 engaged by the pin holder 134 during the downstroke thereof.

Figure 12:
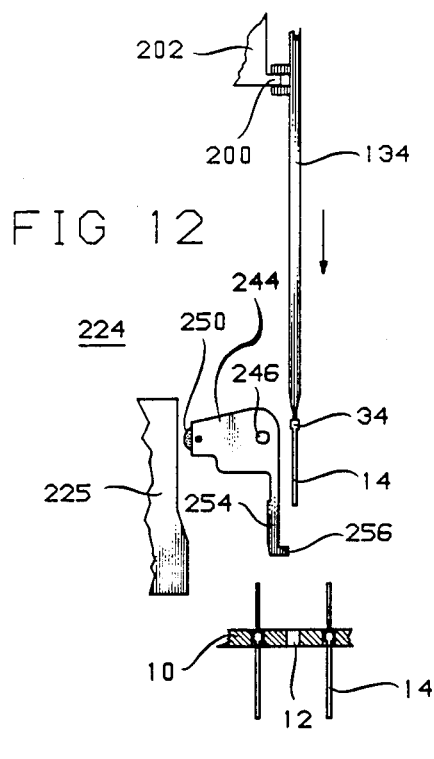
FIGS. 12-15 illustrate the sequence of operation of the pin guidance mechanism of FIG. 10.

FIGS. 12-15 illustrate in sequence how the quiding mechanism 224 guides the pins 14 into the apertures 12 in the backplane 10. Referring to FIG. 12, as the block 202 and the pin holder 134 in engagement with the flange 200 on the block begin their downstroke, the guide fingers 244 (only one shown) remain stationary because the actuation of the lever 236 (see FIG. 10) lags the downstroke of the block 200. Before the lever 236 of FIG. 10 is actuated to displace the shaft 232 (see FIG. 10) downwardly, the pin holder 134 will have descended a sufficient distance to displace a portion of each of the pins 14 engaged thereby through the slots 259 (see FIG. 11) in the combs 256 (only one shown in FIG. 12).

Figure 13:
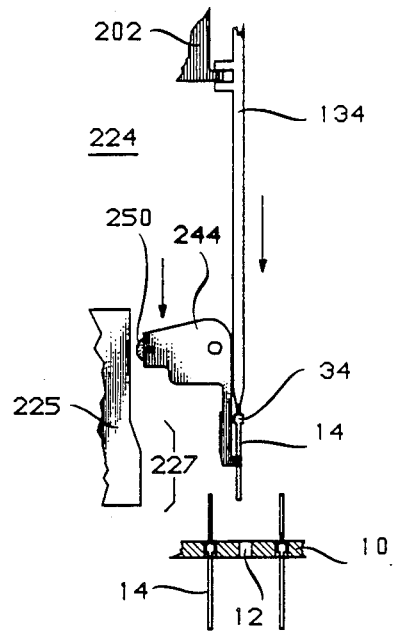

Referring to FIG. 13, once the lever 236 (see FIG. 10) is actuated, the guide fingers 244 now travel downwardly in unison with the block 202 and the pin holder 134. As the guide fingers 244 move downwardly, the combs 256 (only one shown) remain in abutment with each other and in engagement with the pins 14 in the pin holder 134. The combs 256 thus provide guidance to the pins 14 as they are displaced towards the apertures 12 in the backplane 10. As seen in FIG. 14, once the pin holder 134 has descended to a depth at which the pins 14 engaged by the pin holder 134 protrude partially through the apertures 12, each of the wheels 250 on the guide fingers 244 comes into contact with the cammed portion 227 on the corresponding wall 225.

Referring to FIG. 15, the holder 134 and the guide fingers 244 continue to descend until the cylindrical portion 34 on each of pins 14 is forced into the corresponding one of the apertures 12. During the descent of the guide fingers 244 to this depth, the wheels 250 ride along the cammed portion 227 of the walls 225, causing the guide fingers to pivot in opposite directions so that the legs 254 move apart.

As the legs 254 move apart, the combs 256 separate. In this way, the combs 256 will not catch on the shoulders 32 (see FIG. 2) of the pins 14 just inserted into the apertures 12 during the subsequent upstroke of the guide fingers 244 which occurs simultaneously with the upstroke of the block 202. The distance between the legs 254, once they move apart, is chosen smaller than the spacing between the apertures 12 in backplane 10 to avoid interference with either of the rows of previously inserted pins which may exist on either side of the just inserted pin.

Once each pin 14 has been fully inserted into one of the apertures 12, the cylindrical portion 34 of each pin is radially deformed within the aperture 12. When deformed within the aperture 12, the cylindrical portion 34 of the pin 14 exerts a force radially against the aperture. The radial force exerted by the pin 14 against the walls of the aperture 12 is larger than the force retaining the pin in the pin holder 134. Thus, once the pin 14 is inserted into the aperture 12, the pin disengages from the pin holder 134 during the upstroke thereof.

Referring to FIG. 10, if for some reason any of the pins 14 carried by the pin holder 134 do not enter a corresponding one of the apertures 12 in the backplane 10 of FIG. 1, then the pins will likely crumple (although not shown in FIG. 10) as they contact the backplane 10 (see FIG. 3) during the continued descent of the pin holder. Upon the subsequent upstroke of the pin holder 134, the crumpled one of the pins 14 remains engaged thereby. It is likely that the crumpled pin or pins 14 will prevent the combs 256 on the legs 254 of the guide fingers 244 from abutting each other, once the guide fingers have been raised during the upstroke of the shaft 232. If the combs 256 remain separated from each other as they move past the strip 258, then some part of the leg 254 on each guide finger 244 will cross one of the sensors 257, causing the same to be actuated. Thus, by monitoring the status of the sensors 257 during the upstroke of the guide fingers 244, mis-insertion of a pin 14 can be detected.

Referring to FIG. 3, each pin holder 134 indexed into the pin insertion station 198 typically carries five pins 14 previously sheared from the strip 26. Thus, five pins 14 are inserted into five corresponding apertures 12 in the backplane 10 upon the downstroke of each pin holder 134 indexed into the pin insertion station 198. Since each of the sockets 140 (see FIG. 7) depending from the pin holder 134 is smaller in diameter than the spacing between the apertures 12 in the backplane, the pin holder can insert the five pins 14 carried thereby into five apertures 12 in a not-yet-filled row lying between two rows fully populated with pins as seen in FIGS. 12-15 without any interference therewith.

It is also possible for each pin holder 134 indexed into the pin separation station 198 to carry less than five pins 14 for insertion into corresponding apertures in a not-yet-filled row in the backplane 10. When fewer than five pins 14 are inserted into empty apertures in a not-yet-filled row in the backplane 10, no interference occurs with the previously inserted pins in the row closest to the empty apertures. If the pin holder 134 is to insert a single pin 14 in an empty aperture 12 in an otherwise populated row, the four previously inserted pins in the row closest to the empty aperture will be in registration with the empty sockets 140 in the pin holder.

As the pin holder 134 carrying the single pin 14 is displaced towards the empty aperture 12, the pins previously inserted into the four closest apertures will pass through the slots 259 in the combs 258 (see FIG. 11) and seat themselves in the empty sockets 140. Since the force holding each pin 14 within its aperture 12 is greater than the force retaining it within the pin holder 134, none of the previously inserted pins will be withdrawn upon the upstroke of the pin holder. Thus as many as five or as few as one pin may be inserted by the pin holder 134 into the backplane 10 during each downstroke thereof.

Figure 16:
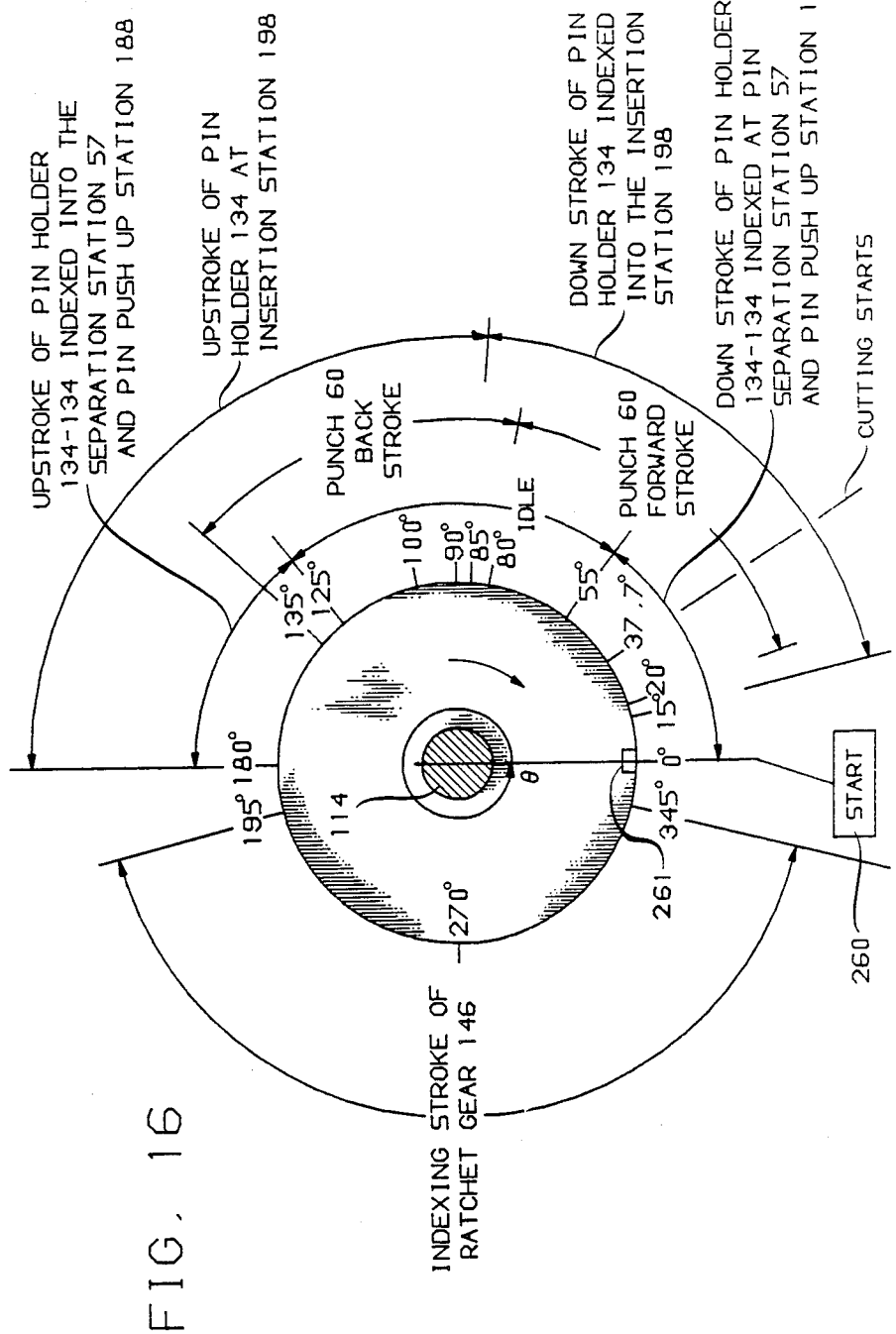
FIG. 16 is a timing diagram illustrating the sequence of operations performed by the pin insertion apparatus of FIG. 3.

FIG. 16 is a timing diagram illustrating the sequence and duration of each operation performed by the pin insertion machine 40 of FIG. 3 during each revolution of the shaft 114. The unit of measure in FIG. 16 is the arc $\theta$ (as measured in degrees) of rotation of the shaft 114 as measured between a fixed frame of reference 260, located at 6 o'clock, and a reference point 261 on the periphery of the shaft. Each degree of the arc $\theta$ corresponds to 1/6 n seconds where n is the speed of the shaft 114 measured in revolutions per minute.

As may be appreciated from FIG. 16, the downstroke of the two pin holders 134 (see FIG. 3) indexed into the pin insertion and pin separation stations 57 and 188, respectively (FIG. 3), begins at $\theta=0°$ and ends at $\theta=55°$. The forward stroke of the punch 60 (see FIG. 3) begins at $\theta=20°$ while the actual cutting or separation of the pins 14 (see FIG. 3) from the strip 26 (see FIG. 2) begins at $\theta=37.7°$. The pin holder 134 indexed into the pin insertion station 198 (see FIG. 3) begins its downstroke at $\theta=15°$ with the completion thereof occurring at $\theta=85°$. The pin holders 134 indexed into the pin separation, pin push-up and pin insertion stations 57, 188 and 198, respectively, are at the top of their stroke and the punch 60 is at the beginning of its forward stroke when $\theta=180°$. The indexing stroke of the ratchet gear 146 (see FIG. 3) begins at $\theta=195°$ and lasts until $\theta=345°$.

Referring to FIG. 3, during downstroke of the pin holder 134 indexed into the pin insertion station 198, indexing of the table 46 must be avoided. Otherwise, there may be interference between the pin holder 134 and the pins 14 already inserted in the backplane 10. For this reason, indexing of the table 46 only occurs during the indexing stroke of the rachet gear 146. To accurately ascertain the initiation and duration of the indexing stroke of the rachet gear 146, a sensing mechanism 262, best illustrated in FIG. 6, is provided.

The mechanism 262 includes a disc 264 carried by the shaft 114 for co-joint rotation therewith. In the periphery of the disc 264 is a cut-out 266. A pair of "L"-shaped brackets 268 are adjustably mounted in spaced relationship to the shaft support 116 closest to the disc 270. The brackets 268 each carry a detector 270 which straddles the periphery of the disc 270 at a point which is 150° from where the other detector straddles the disc. The 150° separation between the detectors 270 along the periphery of the disc 264 corresponds to the 150° duration of the indexing stroke of the ratchet gear 146 of FIG. 3 as described in FIG. 16.

The cut-out 266 in the disc 264 is positioned such that when the indexing stroke of the ratchet gear 146 begins, the cut-out crosses the upper one of the detectors 270, causing it to become actuated. At the end of the indexing stroke of the ratchet gear 146 of FIG. 3, the cut-out 266 crosses the lower one of the detectors 270. Thus, during the interval between the activation of the upper and lower one of the detectors 270, the table 46 of FIG. 3 can be safely indexed.

It is to be understood that the embodiments herein described are merely illustrative of the principles of the present invention. Various modifications and changes may be made by those skilled in the art which will embody the principles of the invention and fall within the spirit and scope thereof.

What is claimed is:

1. A method for inserting a pin into an aperture in a substrate comprising the steps of:
    separating at least one pin from a continuous strip of pins;
    engaging the pin by pin-engaging means;
    imparting a relative motion between the pin-engaging means and the substrate to align a pin with an aperture in the substrate;
    displacing the pin-engaging means to displace the pin towards the aperture to achieve insertion therein;
    simultaneously engaging the pin with guidance means that travel therewith during the displacement of the pin-engaging means for guiding the pin during insertion thereof into the aperture; and
    disengaging the guidance means from the pin after the pin has entered the aperture.

2. The method according to claim 1 wherein the steps are repeated in sequence to insert a plurality of pins into apertures in the substrate.

3. The method according to claim 1 wherein the separating step comprises the steps of:
    advancing a length of the continuous pin strip into a void between a punch and a die; and
    reciprocating the punch to and from the die to shear a pin from the strip.

4. A method for inserting a pin into an aperture comprising the steps of:
    separating a pin from a continuous strip of pins;
    engaging the pin separated from the pin strip in a pin holder;
    displacing the pin holder along an endless path to bring the pin engaged thereby into registration with the aperture;
    displacing the pin holder towards the aperture to achieve insertion therein;
    simultaneously engaging the pin with guidance means that travel therewith during the displacement of the pin holder for guiding the engaged pin during the insertion thereof into the aperture; and
    disengaging the guidance means from the pin after the pin has entered the aperture.

5. The method according to claim 4 wherein the engaging step comprises the steps of:
    reciprocating the pin holder to and from the pin so that an end of the pin is partially received in a passage in the pin holder; and
    reciprocating the pin holder again while simultaneously pushing the pin engaged therein further into the passage.

6. A method for automated insertion of pins into apertures in a substrate comprising the steps of:
    separating a plurality of pins from a continuous strip of pins;
    engaging the pins by pin-engaging means;
    imparting a relative motion between the pin-engaging means and the substrate to align each of the pins with a corresponding aperture in the substrate;
    displacing the pin-engaging means to displace the pins in unison towards the apertures in the substrate to achieve insertion therein;

simultaneously engaging each of the pins with a single guidance means that travels with the pin-engaging means during the displacement thereof to guide the pins into the apertures; and disengagng the guidance means from the pins after each pin has entered its aperture.

7. The method according to claim 6 wherein the aligning step comprises the steps of:

engaging the pins separated from the pin strip in a pin holder; and displacing the pin holder along an endless path to bring each of the pins engaged thereby into registration with a corresponding one of the apertures in the substrate.

8. A method for automatically inserting pins into apertures in a backplane comprising the steps of:

shearing a predetermined number of pins from a continuous strip of pins;

engaging the pins sheared from the strip in a pin holder;

indexing the pin holder along an endless path to bring the pins engaged thereby to a pin insertion station;

indexing the backplane so that each of a predetermined number of apertures therein is in registration with one of the pins engaged by the pin holder indexed to the pin insertion station;

displacing the pin holder at the pin insertion station towards the backplane to insert each pin engaged by the pin holder into a corresponding aperture; while simultaneously guiding the pins into the corresponding apertures during insertion therein.

9. A method of guiding a pin, engaged by pin-engaging means, during the displacement of the pin-engaging means towards a substrate for insertion of the pin into an aperture in the substrate, comprising the steps of:

engaging the pin with guidance means during the displacement of said pin-engaging means towards the substrate to guide the pin during insertion thereof into the aperture; and disengaging the guidance means from the pin after the pin has entered the aperture.

10. An apparatus for guiding a pin, engaged by pin-engaging means, during the displacement of the pin-engaging means towards the substrate for insertion of the pin into an aperture in the substrate, comprising:

guidance means for engaging the pin during the displacement of the pin-engaging means towards the substrate;

means for displacing the guidance means simultaneously with the pin-engaging means so the guidance means travels therewith towards the substrate to guide the pin during insertion thereof into the aperture; and means for disengaging the guidance means from the pin after the pin has entered the aperture.

11. Apparatus for automatically inserting a pin into a backplane comprising:

means for separating at least one pin from a continuous strip of pins;

means for engaging the separated pin;

means for imparting a relative motion between the backplane and the pin-engaging means to align the pin with an aperture in the substrate;

means for displacing the pin-engaging means towards the aperture to insert the pin therein; and pin guidance means coupled to said displacing means for traveling with the pin-engaging means during the displacement thereof to guide the pin into the aperture, the pin guidance means disengaging from the pin after the pin has entered the aperture.

12. The apparatus according to claim 11 wherein said pin separating means comprises:

a die;

a punch movable to and from the die; and means for guiding a length of the continuous pin strip in between the punch and the die.

13. Apparatus for automatically inserting a pin into an aperture in a backplane comprising:

means for separating a pin from a continuous strip of pins;

an endless rail having a first opening therein in registration with the pin separating means and a second opening therein in registration with the substrate, respectively;

a pin holder slidably mounted for movement along said rail for engaging the pin separated from the strip;

means for indexing the pin holder along the rail between the first and second openings therein;

means proximate the first opening in the rail for reciprocating the pin holder indexed into the first opening to and from said pin separating means to cause the pin holder to engage the pin separated from the strip;

means for displacing the engaged pin towards the aperture to insert the pin therein; and pin guidance means coupled to said displacing means for traveling therewith during the displacement thereof to guide the engaged pin into the aperture, the pin guidance means disengaging from the pin after the pin has entered the aperture.

14. The invention according to claim 13 further including means for operating the pin separating means, the pin inserting means and the indexing means in sequence.

15. The invention according to claim 13 wherein the inserting means comprises:

second means proximate the second opening in the rail for reciprocating the pin holder indexed into said second opening to and from the substrate to cause said pin holder to insert the pins engaged thereby into the apertures.

16. The invention according to claim 15 wherein said guiding means comprises:

a pair of fingers, each pivotally mounted to said second means so as to straddle the pin engaged by said pin holder to guide the pin into the aperture; and means for pivoting the guide fingers away from the pin upon the entry of the pin into the aperture.

17. Apparatus for automated insertion of pins into a substrate comprising:

a frame;

an endless chain rotatably journaled to said frame;

a plurality of pin holding means each slidably mounted to said chain in spaced, parallel relationship;

pin separating means carried by said frame in registration with one of the pin holding means mounted to said chain, said pin separating means separating a predetermined number of pins from a continuous pin strip;

actuating means carried by said frame for reciprocating the pin holding means in registration with the pin separating means so that said pin holding means moves to and from the pin separating means to engage the pins separated from the strip;

pin inserting means carried by said frame in spaced relationship with said pin separating means along the orbit of the chain for reciprocating a pin-carrying one of said pin holding means to and from the substrate to insert the pins into corresponding apertures therein;

pin guiding means operatively connected to said pin inserting means for engaging the pins so as to travel therewith to guide the engaged pins into the apertures in the substrate upon the reciprocation of the pin holding means and for disengaging the pins when insertion thereof has been substantially completed; and means for indexing the chain to index each of the pin holding means into said pin separating means and said pin inserting means.

18. The invention according to claim 17 further including means for indexing the substrate to locate selected apertures therein in registration with the pin inserting means.

* * * * *